United States Patent
Tsukao

(10) Patent No.: US 10,368,443 B2
(45) Date of Patent: Jul. 30, 2019

(54) CONNECTION BODY, METHOD FOR MANUFACTURING CONNECTION BODY, AND METHOD FOR INSPECTING SAME

(71) Applicant: DEXERIALS CORPORATION, Shinagawa-ku, Tokyo (JP)

(72) Inventor: Reiji Tsukao, Tochigi (JP)

(73) Assignee: DEXERIALS CORPORATION, Osaka (JP)

( * ) Notice: Subject to any disclaimer, the term of this patent is extended or adjusted under 35 U.S.C. 154(b) by 0 days.

(21) Appl. No.: 15/580,856

(22) PCT Filed: Jun. 14, 2016

(86) PCT No.: PCT/JP2016/067620
§ 371 (c)(1),
(2) Date: Dec. 8, 2017

(87) PCT Pub. No.: WO2016/204136
PCT Pub. Date: Dec. 22, 2016

(65) Prior Publication Data
US 2018/0168044 A1 Jun. 14, 2018

(30) Foreign Application Priority Data
Jun. 16, 2015 (JP) ................ 2015-120969

(51) Int. Cl.
| H05K 1/18 | (2006.01) |
| G02F 1/1345 | (2006.01) |
| H05K 1/02 | (2006.01) |
| H05K 1/11 | (2006.01) |
| H05K 3/30 | (2006.01) |
| H05K 3/32 | (2006.01) |

(52) U.S. Cl.
CPC .......... *H05K 1/181* (2013.01); *G02F 1/1345* (2013.01); *H05K 1/0274* (2013.01); *H05K 1/111* (2013.01); *H05K 3/305* (2013.01); *H05K 3/323* (2013.01); *H05K 2201/10984* (2013.01)

(58) Field of Classification Search
CPC ............. H05K 1/181; H05K 3/32; H05K 3/34
USPC .......................................... 174/260; 361/760
See application file for complete search history.

(56) References Cited

U.S. PATENT DOCUMENTS 8,391,016 B2 * 3/2013 Hwang ............. H01L 23/49816
257/E23.03
8,633,396 B2 * 1/2014 Lee ......................... H01L 24/11
174/257

(Continued)

FOREIGN PATENT DOCUMENTS

| JP | 2001-110832 A | 4/2001 |
| JP | 2004-214374 A | 7/2004 |

(Continued)

OTHER PUBLICATIONS

Aug. 30, 2016 International Search Report issued in International Patent Application No. PCT/JP2016/067620.

(Continued)

*Primary Examiner* — Dhiru R Patel
(74) *Attorney, Agent, or Firm* — Oliff PLC

(57) ABSTRACT

A connection body for which a determination of the pass/fail of the electrical continuity can be made by an indentation inspection and in which conduction reliability is ensured.

6 Claims, 14 Drawing Sheets

(56) References Cited

U.S. PATENT DOCUMENTS 8,654,538 B2 * 2/2014 Kariya ................ H01L 23/5389
174/260
8,772,648 B2 * 7/2014 Furutani ............... H01L 21/486
174/260

FOREIGN PATENT DOCUMENTS

| JP | 2005-203758 A | 7/2005 |
| JP | 2009-057631 A | 3/2009 |
| JP | 2009-134914 A | 6/2009 |
| JP | 2009-238635 A | 10/2009 |
| JP | 4789738 B2 | 10/2011 |
| JP | 2015-025104 A | 2/2015 |
| WO | 2008/149678 A1 | 12/2008 |

OTHER PUBLICATIONS

Apr. 16, 2019 Office Action issud in Korean Patent Application No. 10-2017-7032523.

* cited by examiner

CONNECTION BODY, METHOD FOR MANUFACTURING CONNECTION BODY, AND METHOD FOR INSPECTING SAME

TECHNICAL FIELD

The present invention relates to a connection body in which an electronic component and a transparent board are connected to each other, and in particular relates to a connection body in which an electronic component is connected to a transparent board interposed by an adhesive that contains electrically conductive particles, and also relates to a method for manufacturing such a connection body and a method for manufacturing the same.

The present application claims priority on the basis of JP 2015-120969 B filed on Jun. 16, 2015 in Japan, and this application is incorporated into the present application by reference.

BACKGROUND ART

From the past, liquid crystal display devices and organic electroluminescent (EL) panels have been used as display means of various types, such as monitors for televisions or PC monitors, displays for portable telephones or smartphones, displays for portable type game machines, displays for tablet terminals or wearable terminals, or displays for use in vehicles or the like. In recent years, in display devices of this type, from the standpoint of providing finer pitch, reducing weight, and enhancing thinness, various manufacturing methods have been employed. In such manufacturing methods, drive ICs are mounted directly on a glass board of a display panel, or a flexible board on which drive circuitry or the like is formed is mounted directly on a transparent board, such as a glass board, of a display panel with the use of anisotropic electrically conductive film (ACF).

A plurality of transparent electrodes made from indium tin oxide (ITO) or the like are formed on a glass board to which ICs or a flexible board are to be mounted. Electronic components such as ICs or a flexible board are connected to these transparent electrodes. In such electronic components that are to be connected to the glass board, a plurality of electrode terminals (bumps) corresponding to the transparent electrodes are formed on their mounting surfaces. The electronic components are thermocompression-bonded to the glass board interposed by an anisotropic electrically conductive film. Thus, the electrode terminals and the transparent electrodes are connected to each other.

An anisotropic electrically conductive film is made by mixing electrically conductive particles into a binder resin and shaping the result into a film. The anisotropic electrically conductive film is thermocompression-bonded between two electrical conductors, thereby providing electrical continuity between two electrical conductors and maintaining mechanical connection between two electrical conductors via the binder resin. A thermosetting binder resin having high reliability is commonly employed as the adhesive incorporated in such an anisotropic electrically conductive film. A photocurable binder resin or a photo-thermal dual curing type binder resin may also be employed as the adhesive.

When an electronic component is connected to a transparent electrode interposed by such an anisotropic electrically conductive film, first, the anisotropic electrically conductive film is provisionally adhered to the transparent electrode of the glass board with a provisional pressure bonding means (not illustrated). And, next, after a temporary connection body has been formed by mounting the electronic component on the glass board interposed by the anisotropic electrically conductive film, the electronic component is heated and pressed toward the transparent electrode along with the anisotropic electrically conductive film by a thermocompression bonding means such as a thermocompression bonding head or the like. By applying heat with this thermocompression bonding head, the anisotropic electrically conductive film undergoes a thermal hardening reaction, and due to this the electronic component is adhered to the transparent electrode.

CITATION LIST

Patent Literature

Patent Document 1: JP 4789738 B
Patent Document 2: JP 2004-214374 A
Patent Document 3: JP 2005-203758 A

SUMMARY OF INVENTION

Technical Problem

In the connection process using such an anisotropic electrically conductive film, the step of heating and pressing the connection region of an electronic component to be connected is, normally, not performed in such a manner that a large number of mounting parts are heated and pressed together, over a large area in total. The reasons for this are that, for example, the area of the connection region of the electronic component is relatively small with respect to the area of a connection target electronic component, and the plurality of bumps, arrayed on the connection region, need to satisfy a certain degree of parallelism. However, what is stated above does not apply to the case where electronic components for which the degree of parallelism required is relatively low are connected all at once to increase productivity.

Thus, for the connection process using an anisotropic electrically conductive film, in order to increase productivity, there is a need for shortening the time period for the connection process itself, and in addition, there is a need for speeding up the inspection process after connection in association with the shortening of the time period.

The inspection after connection is a process of checking whether electrical continuity has been established via electrically conductive particles squashed between the bumps of the electronic component and the transparent electrodes of the glass board. To speed up the process, an external inspection is sometimes employed in which indentations, of the electrically conductive particles, appearing in the transparent electrodes are observed from the rear side of the glass board. Furthermore, for inspection after connection, a visual inspection by a human may be performed and/or captured images may be used to observe the state of the indentations and the state of the adhesive in the vicinity for delamination or peeling.

Bumps of some electronic components have a recess and projection in the bump surface where electrically conductive particles are to be trapped. However, when electrically conductive particles are trapped by bumps having a recess and projection in the surface, sometimes indentations do not appear sufficiently. As a result, even when there is no problem with electrical continuity, a failure determination may be made in an indentation inspection. Furthermore, when electrically conductive particles fit into recess portions, forcing of the particles may not be sufficiently accomplished, and the projection portions may directly contact the electrodes. As a result, conduction reliability may be compromised.

Accordingly, an object of the present invention is to provide a connection body for which a determination of the pass/fail of the electrical continuity can be made by an indentation inspection and in which conduction reliability is ensured, and to provide a method for manufacturing such a connection body and a method for inspecting the same.

Solution to Problem

To solve the above-described problems, a connection body according to the present invention is provided. The connection body includes a transparent board and an electronic component. The transparent board includes a plurality of terminals, and the electronic component includes a plurality of bumps and are connected to the transparent board via an anisotropic electrically conductive adhesive including electrically conductive particles dispersed in a binder resin. The plurality of bumps are electrically connected to the plurality of terminals via the electrically conductive particles. The electrically conductive particles are independent of and out of contact with one another. Each of the bumps includes, in a surface thereof, a recess and projection having a height difference of greater than or equal to 10% of a particle size of the electrically conductive particles. The surface is a surface where the electrically conductive particles are trapped. The recess and projection includes a projection portion defining a maximum projection. In the surface of each bump, at least one region having a height difference of greater than or equal to 20% of the particle size of the electrically conductive particles occupies less than or equal to 70% of a surface area of the bump, the height difference being measured from the projection portion.

Furthermore, according to the present invention, a method for manufacturing a connection body is provided. In the method, an electronic component is mounted on a transparent board via an adhesive including electrically conductive particles. The electronic component is pressed against the transparent board and the adhesive is cured to electrically connect bumps of the electronic component to terminals of the transparent board via the electrically conductive particles. In the anisotropic electrically conductive adhesive, the electrically conductive particles are dispersed in a binder resin to be independent of and out of contact with one another. Each of the bumps includes, in a surface thereof, a recess and projection having a height difference of greater than or equal to 10% of a particle size of the electrically conductive particles, the surface being a surface where the electrically conductive particles are trapped. The recess and projection includes a projection portion defining a maximum projection. In the surface of each bump, at least one region having a height difference of greater than or equal to 20% of the particle size of the electrically conductive particles occupies less than or equal to 70% of a surface area of the bump, the height difference being measured from the projection portion.

Furthermore, according to the present invention, an inspection method for inspecting a connection status of a connection body is provided. The connection body includes a transparent board and an electronic component. The transparent board includes a plurality of terminals and the electronic component includes a plurality of bumps. The electronic component is connected to the transparent board via an anisotropic electrically conductive adhesive including electrically conductive particles dispersed therein. The method includes inspecting a connection status of the electronic component by observing indentations of the electrically conductive particles included in the anisotropic electrically conductive adhesive. The indentations appear in the terminals of the transparent board. In the anisotropic electrically conductive adhesive, the electrically conductive particles are dispersed in a binder resin to be independent of and out of contact with one another. Each of the bumps includes, in a surface thereof, a recess and projection having a height difference of greater than or equal to 10% of a particle size of the electrically conductive particles, the surface being a surface where the electrically conductive particles are trapped. The recess and projection includes a projection portion defining a maximum projection. In the surface of each bump, at least one region having a height difference of greater than or equal to 20% of the particle size of the electrically conductive particles occupies less than or equal to 70% of a surface area of the bump, the height difference being measured from the projection portion.

Advantageous Effects of Invention

In the present invention, each of the bumps includes, in the surface, a recess and projection having a height difference of greater than or equal to 10% of the particle size of the electrically conductive particles. In the surface of each bump, at least one region having a height difference of greater than or equal to 20% of the electrically conductive particles occupies less than or equal to 70% of the surface area of the bump, with the height difference being measured from the position defining the maximum projection. Thus, even when an electrically conductive particle is trapped on the recess portion, the electrically conductive particle can be sufficiently forced by the recess portion. As a result, the visibility of indentations is not compromised and the reliability of conduction inspections using the indentations is ensured.

Furthermore, even when an electrically conductive particle is trapped on the recess portion, the electrically conductive particle is sufficiently forced by the recess portion, and the projection portion does not directly contact the terminal. Moreover, in the anisotropic electrically conductive film, the electrical conductive particles are dispersed to be independent of and out of contact with one another. As a result, the electrically conductive particles can also be trapped on the projection portion. Thus, with the present invention, conduction reliability between the bumps and the terminals is maintained.

BRIEF DESCRIPTION OF DRAWINGS

FIG. 10A is a plan view and FIG. 10B is a sectional view.

FIG. 11A is a plan view and FIG. 1.1B is a sectional view.

FIG. 12A is a plan view and FIG. 12B is a sectional view.

FIG. 13A is a plan view and FIG. 13B is a sectional view.

FIG. 14A illustrates a case where an anisotropic electrically conductive film in which electrically conductive particles are randomly scattered is used.

FIG. 14B illustrates a case where an anisotropic electrically conductive film in which electrically conductive particles are disposed in rows is used.

DESCRIPTION OF EMBODIMENTS

In the following, connection bodies to which the present invention is applied, methods for manufacturing such connection bodies, and methods for inspecting the same will be described in detail with reference to the drawings. It should be understood that the present invention is not to be considered as being limited to the embodiments described below; of course, various alterations could be made, provided that there is no deviation from the gist of the present invention. Moreover, the drawings are only to be considered as being schematic; in some cases, the ratios of the dimensions illustrated are different from those actually employed. The concrete dimensions and the like need to be determined with reference to the following explanation. Furthermore, of course, there are portions for which the relationships and ratios between the mutual dimensions are different between the various drawings.

Liquid Crystal Display Panel

Figure 1:
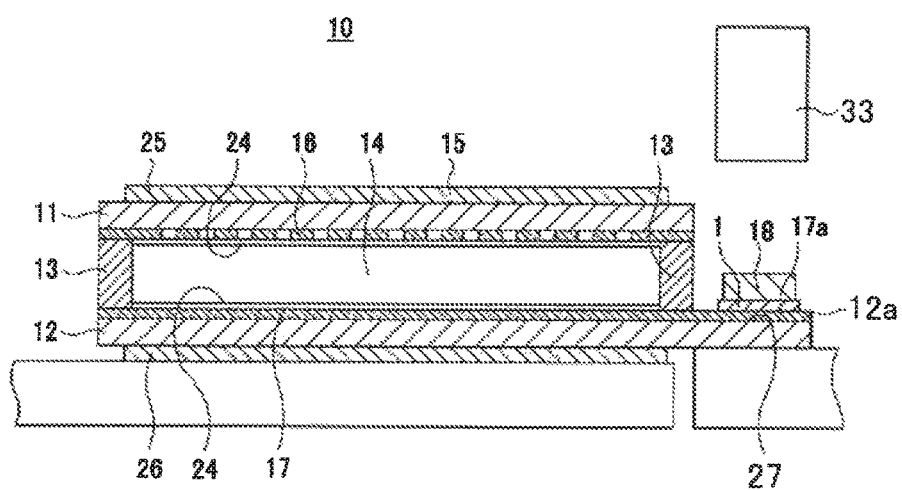
FIG. 1 is a sectional view of a liquid crystal display panel illustrated as an example of a connection body.

In the following, a liquid crystal display panel will be described as connection bodies to which the present invention is applied. In the liquid crystal display panel, one or more liquid crystal drive IC, chips are mounted, as an electronic component, on a glass board. As illustrated in FIG. 1, in this liquid crystal display panel 10, two transparent boards 11 and 12 made from glass board or the like are arranged to be mutually opposite each other, with these transparent boards 11 and 12 being glued to each other via a frame shaped seal 13. A panel display unit 15 is formed using this liquid crystal display panel 10, with liquid crystal 14 being sealed within the space surrounded by the transparent boards 11 and 12.

A pair of transparent electrodes 16 and 17 shaped as bands made from indium tin oxide (ITO) or the like are formed on the mutually opposing internal surfaces of the transparent boards 11 and 12, while mutually intersecting one another. Pixels are defined at the sites of intersection between the transparent electrodes 16 and 17, with these pixels constituting the minimum units of this liquid crystal display.

Figure 2:
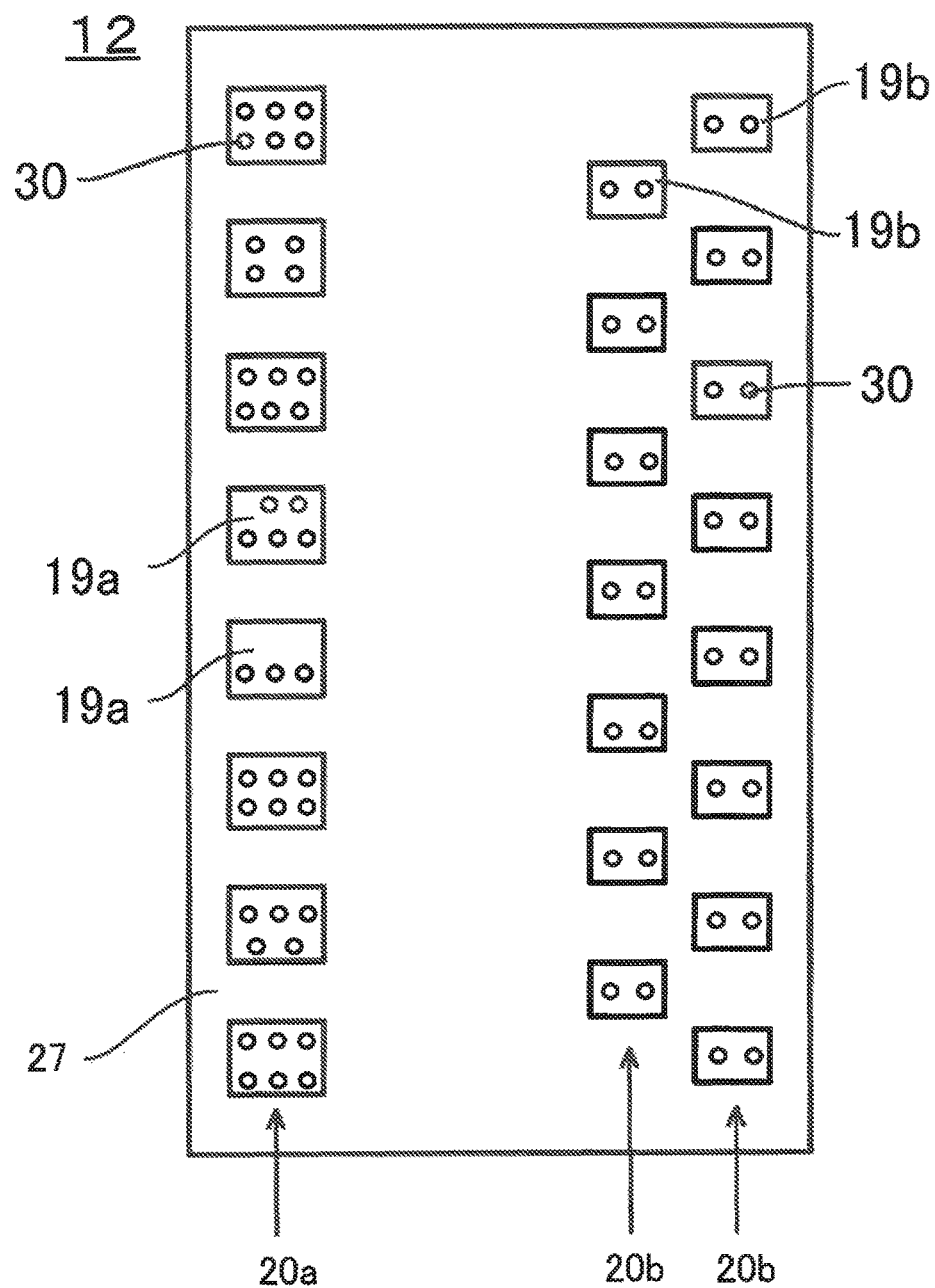
FIG. 2 is a bottom view illustrating the state of indentations that appear in input and output terminals, as viewed from the rear surface of a transparent board.
Figure 3:
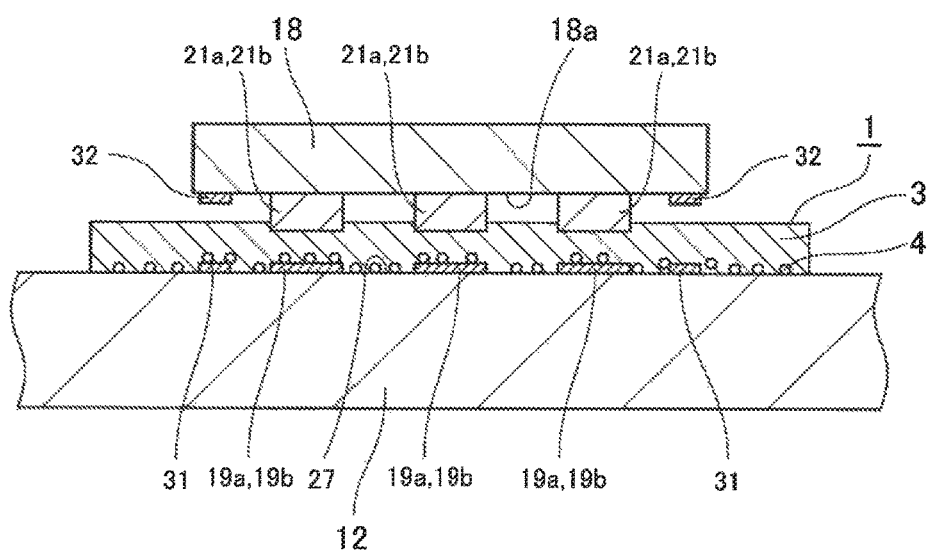
FIG. 3 is a sectional view illustrating a process of connection of a liquid crystal drive IC and a transparent board.

Between the two transparent boards 11 and 12, the transparent board 12 is formed with its planar dimensions being larger than those of the other transparent board 11, and a mounting portion 27 is provided at an edge 12a of the transparent board 12 formed to be larger. A liquid crystal drive IC 18 is mounted on the mounting portion 27 as an electronic component. As illustrated in FIGS. 2 and 3, an input terminal array 20a, an output terminal array 20b, and board side alignment marks 31 are formed on the mounting portion 27. The input terminal array 20a includes a plurality of input terminals 19a of the transparent electrode 17 arranged in the input terminal array 20a. The output terminal array 20b includes a plurality of output terminals 19b arranged in the output terminal array 20b. The board side alignment marks 31 are to be superimposed on IC side alignment marks 32 provided on the liquid crystal drive IC 18.

Figure 4:
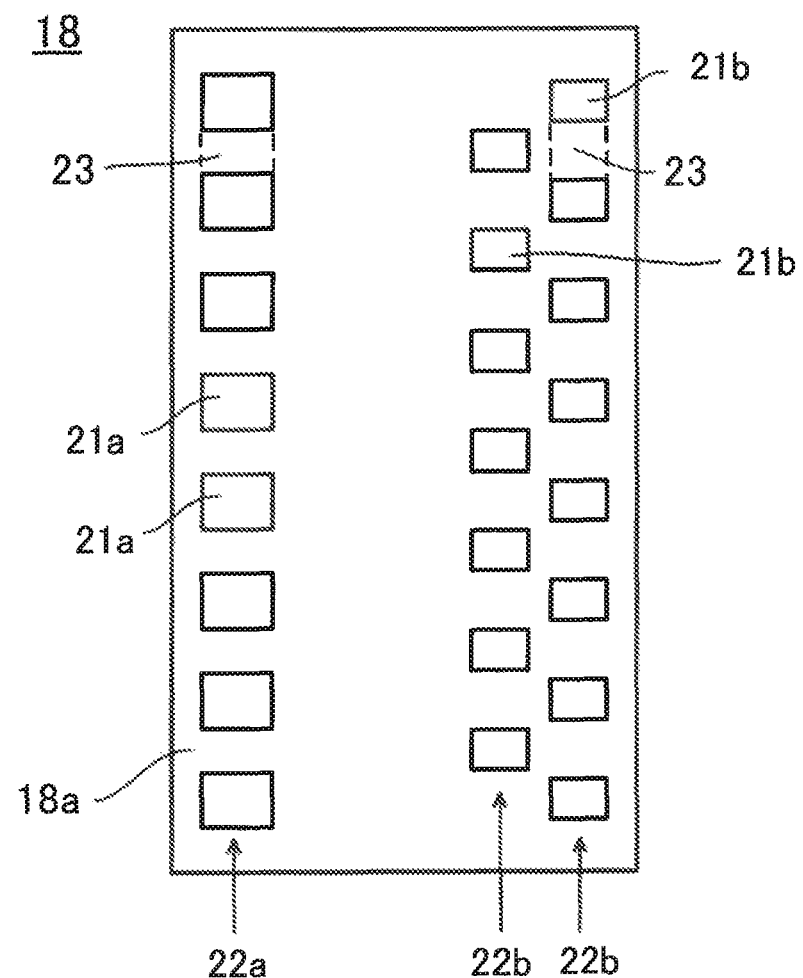
FIG. 4 is a plan view illustrating electrode terminals (bumps) of a liquid crystal drive IC and spaces between these terminals.

The liquid crystal drive IC 18 is configured to cause the orientation of a part of the liquid crystal to change by selectively applying liquid crystal drive voltages to the pixels so that a predetermined liquid crystal display can be provided. Moreover, as illustrated in FIGS. 3 and 4, the liquid crystal drive IC 18 includes an input bump array 22a and an output bump array 22b on a mounting surface 18a of the liquid crystal drive IC 18 facing the transparent board 12. The input bump array 22a includes a plurality of input bumps 21a arranged in the input bump array 22a for providing electrically conductive connection to the input terminals 19a of the transparent electrode 17. The output bump array 22b includes a plurality of output bumps 21b arranged in the output bump array 22b for providing electrically conductive connection to the output terminals 19b of the transparent electrode 17. For example, copper bumps, gold bumps, or copper bumps that have been gold plated or the like may be suitably employed for the input bumps 21a and the output bumps 21b.

For example, the input bumps 21a are arranged in a single array along one side edge of the mounting surface 18a, and the output bumps 21b are arranged in a plurality of arrays in a staggered manner along the other side edge opposite to the aforementioned one side edge. The input and output bumps 21a and 21b and the input and output terminals 19a and 19b provided in the mounting portion 27 of the transparent board 12 are formed in the same numbers and at the same pitches, and are connected together by the transparent board 12 and the liquid crystal drive IC 18 being positioned and connected together.

Note that the arrangements of the input and output bumps 21a and 21b may be different from those illustrated in FIG. 4. The input bumps 21a may be arranged in one or a plurality of arrays along the one side edge, and the output bumps 21b may be arranged in one or a plurality of arrays along the other side edge. Any of these structures would be acceptable. Furthermore, for the input and output bumps 21a and 21b, one array arrangement may partially include a plurality of arrays and a plurality of array arrangement may partially include one array. Furthermore, for the input and output bumps 21a and 21b, when arranged in a plurality of arrays, the arrays may be parallel to each other and adjacent electrode terminals may be linearly aligned side by side, or the arrays may be parallel to each other and adjacent electrode terminals may be staggered relative to each other with the displacement being uniform throughout the array.

Furthermore, on the liquid crystal drive IC 18, along with the input and output bumps 21a and 21b being arranged along the long sides of the IC board, it would also be acceptable for side bumps to be formed along one or more of the short sides of the IC board. The input and output bumps 21a and 21b may be formed to be of the same dimensions; or of different dimensions. Moreover, in the input and output bump arrays 22a and 22b, the input and output bumps 21a and 21b formed to be of the same dimensions could be symmetrically or asymmetrically arranged in their bump arrays. The input and output bumps 21a and 21b formed to be of different dimensions could be asymmetrically arranged in their bump arrays.

In recent years, along with a trend to make electronic devices such as liquid crystal display devices and others more compact and to enhance their functions, electronic components such as liquid crystal drive ICs 18 and the like have also required to be more compact and lower in profile, and the heights of the input and output bumps 21a and 21b also have become lower (for example, from 6 to 15 μm).

Moreover, the IC side alignment marks 32 are formed on the mounting surface 18a of the liquid crystal drive IC 18 in order for alignment with the transparent board 12 to be performed by superimposing these IC side alignment marks over the board side alignment marks 31. The alignment adjustment between the liquid crystal drive IC 18 and the transparent board 12 needs to be performed at high accuracy, since narrowing down of the wiring pitch of the transparent electrodes 17 of the transparent board 12 and of the pitch of the input and output bumps 21a and 21b of the liquid crystal drive IC 18 has progressed remarkably.

Marks of various types may be used as the board side alignment marks 31 and the IC side alignment marks 32, provided that good alignment between the transparent board 12 and the liquid crystal drive IC 18 may be obtained by matching these marks together.

The liquid crystal drive IC 18 is connected to the input and output terminals 19a and 19b of the transparent electrode 17 formed on the mounting portion 27 by using an anisotropic electrically conductive film 1, which acts as an adhesive for circuit connection. The anisotropic electrically conductive film 1 contains electrically conductive particles 4, and is provided for electrically connecting the input and output bumps 21a and 21b of the liquid crystal drive IC 18 to the input and output terminals 19a and 19b of the transparent electrode 17 formed on the mounting portion 27 of the transparent board 12, via the electrically conductive particles 4. By thermocompression bonding using a thermocompression bonding head 33, the binder resin in the anisotropic electrically conductive film 1 is caused to flow so that the electrically conductive particles 4 are pressed and squashed between the input and output terminals 19a and 19b and the input and output bumps 21a and 21b of the liquid crystal drive IC 18, and then the binder resin is hardened in this state. Due to this processing, the anisotropic electrically conductive film 1 electrically and mechanically connects the transparent board 12 and the liquid crystal drive IC 18.

Furthermore, alignment layers 24 are formed on both the transparent electrodes 16 and 17. Predetermined rubbing processing is performed on the alignment layers 24. The initial alignments of the liquid crystal molecules come to be regulated by these alignment layers 24. Moreover, a pair of light polarizing plates 25 and 26 are disposed on the exterior surfaces of the two transparent boards 11 and 12. The direction of oscillation of transmitted light emitted from a light source such as a backlight or the like (not illustrated in the drawings) is regulated by these two light polarizing plates 25 and 26.

Recess and Projection

Figure 5:
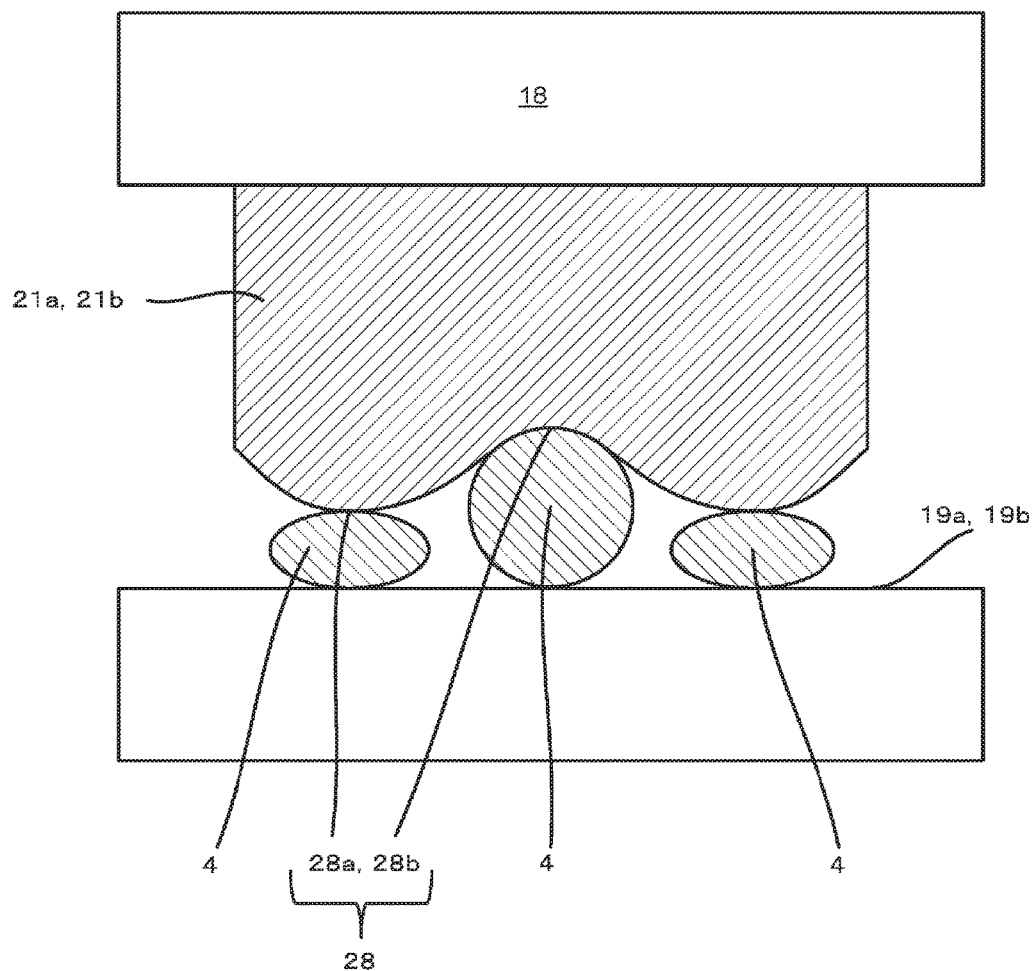
FIG. 5 is a sectional view illustrating a state in which electrically conductive particles are held on regions having a height difference of less than 20% of the particle size of the electrically conductive particles.
Figure 6:
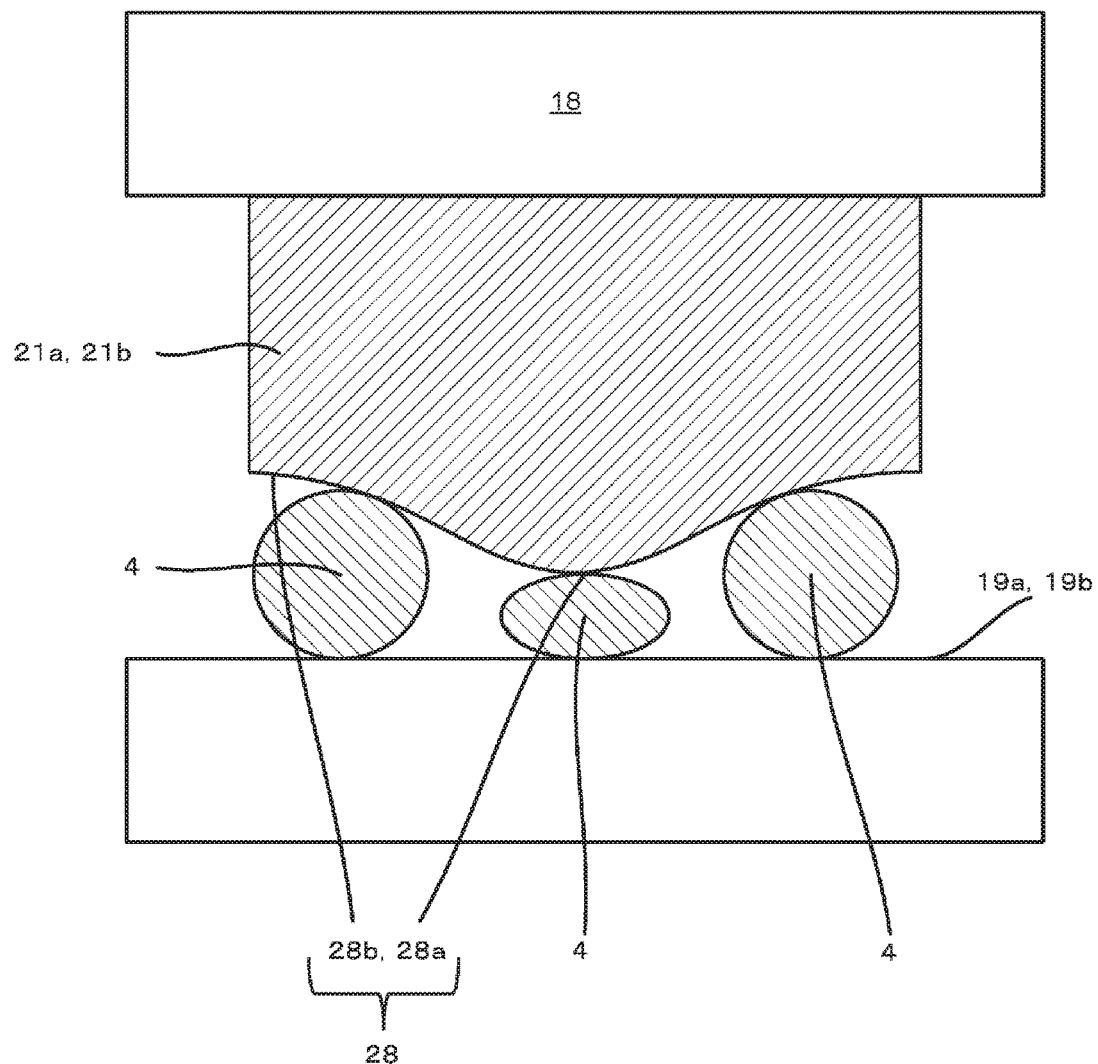
FIG. 6 is a sectional view illustrating a state in which an electrically conductive particle is held on a region having a height difference of less than 20% of the particle size of the electrically conductive particles.

The input and output bumps 21a and 21b of the liquid crystal drive IC 18 each include a recess and projection 28 in the surface where the electrically conductive particles 4 are to be trapped. The recess and projection 28 has a height difference of greater than or equal to 10% of the particle size of the electrically conductive particles 4 as measured prior to pressing. As illustrated in FIGS. 5 and 6, for example, the recess and projection 28 is formed to protrude on both side edges or on a middle portion of the surface where the electrically conductive particles 4 are to be trapped. The height difference of the recess and projection 28 refers to the difference in height between a projection portion(s) 28a and a recess portion(s) 28b of the surface of each of the input and output bumps 21a and 21b. The projection portion 28a defines the maximum projection and the recess portion 28b is recessed relative to the projection portion 28a. The height difference of the recess and projection 28 can be measured using, for example, a high precision profilometry system (trade name: KS-1100, available from KEYENCE CORPORATION). In many cases, the recess and projection 28 is formed on the side edges of the hump surface (see FIG. 5), on a middle portion of the bump surface (see FIG. 6), or on both of them.

In the surface of each bump, the recess and projection 28 is configured as follows. At least one region having a height difference of greater than or equal to 2.0% of the particle size of the electrically conductive particles occupies less than or equal to 70% of the surface area of the bump. The height difference is measured from the projection portion 28a, which defines the maximum projection. As will be described later, the electrically conductive particles 4, trapped on the input and output bumps 21a and 21b are independent of and out of contact with one another. Thus, by configuring the region having a height difference of greater than or equal to 20% of the particle size of the electrically conductive particles 4 to occupy less than or equal to 70% of the surface area of the bump, the following is achieved. Even in a case where an electrically conductive particle 4 is trapped on the region, another one or more of the electrically conductive particles 4 can be trapped on the region having a height difference of less than 20% of the particle size of the electrically conductive particles 4. Thus, the electrically conductive particle 4 can be sufficiently forced by the region, and as a result, the visibility of indentations is not compromised. Consequently, the reliability of conduction inspections using indentations is improved. Moreover, the conduction reliability between the input and output bumps 21a and 21b and the input and output terminals 19a and 19b is maintained even when the environment changes after connection.

Furthermore, the electrically conductive particles 4 can be trapped on the region having a height difference of less than 20% of the particle size of the electrically conductive particles 4. As a result, sufficient forcing of the electrically conductive particles 4 can be accomplished by the region, and in addition, the projection portion 28a does not directly contact the input terminal 19a or the output terminal 19b. Thus, the input and output bumps 21a and 21b and the input and output terminals 19a and 19b are electrically conductively connected to each other via the electrically conductive particles 4 sandwiched therebetween. Good conduction reliability is maintained even when the environment changes after connection.

Furthermore, as will be described later, the electrically conductive particles 4 in the anisotropic electrically conductive film 1, which are independent of and out of contact with one another, are unevenly distributed on the surface of the bump. With this configuration, some of the electrically conductive particles 4 can be trapped on the projection portions 28a, on the input and output bumps 21a and 21b. As a result, in the liquid crystal display panel 1, indentations of those of the electrically conductive particles 4 that have been trapped on the projection portions 28a appear more clearly, and thus the reliability of conduction inspections using indentations is increased. Also, in the liquid crystal display panel 1, because of the electrically conductive particles 4 trapped on the projection portions 28a, the conduction reliability between the input and output bumps 21a and 21b and the input and output terminals 19a and 19b is maintained even when the environment changes after connection.

Figure 7:
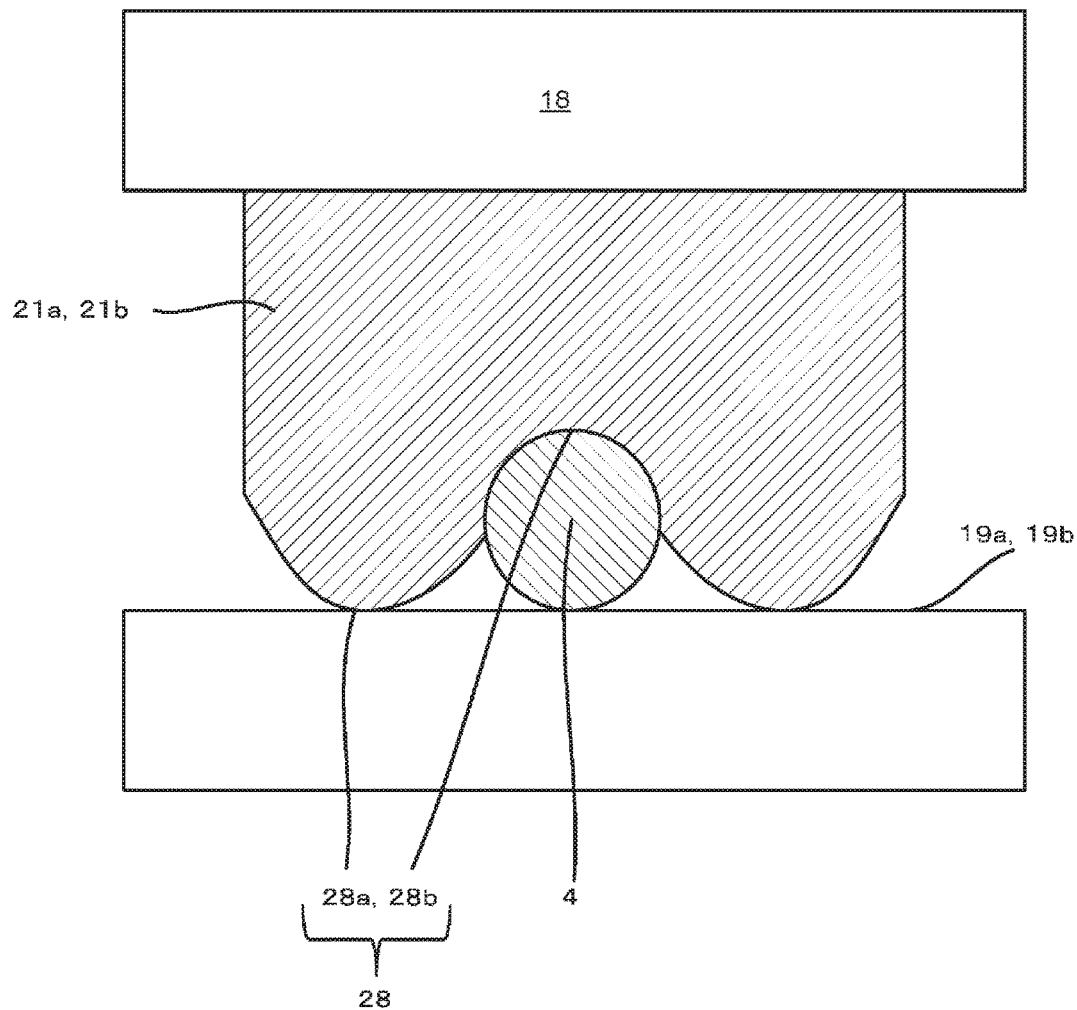
FIG. 7 is a sectional view illustrating a state in which an electrically conductive particle is held on a region having a height difference of greater than or equal to 20% of the particle size of the electrically conductive particles.
Figure 8:
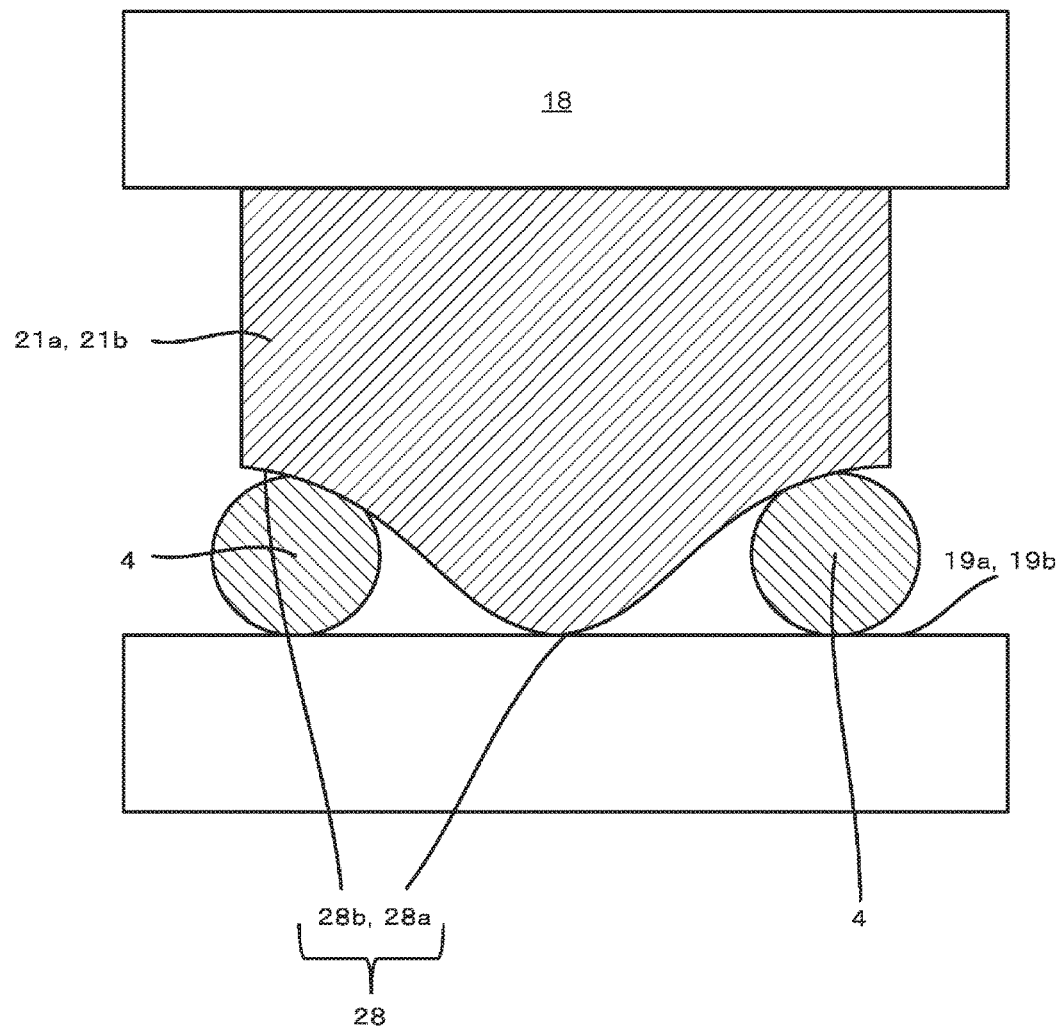
FIG. 8 is a sectional view illustrating a state in which electrically conductive particles are held on regions having a height difference of greater than or equal to 20% of the particle size of the electrically conductive particles.

On the other hand, in a case where, in the recess and projection 28, the region having a height difference of greater than or equal to 20% of the particle size of the electrically conductive particles 4 occupies greater than 70% of the surface area of the bump, a fewer number of electrically conductive particles 4 can be trapped on the region having a height difference of less than 20% of the particle size of the electrically conductive particles 4. As a result, in a case where an electrically conductive particle 4 is trapped on the region having a height difference of greater than or equal to 20% of the particle size of the electrically conductive particles 4 as illustrated in FIGS. 7 and 8, forcing of the electrically conductive particles 4 will be insufficient, which will result in an increased electrical conduction resistance. In the case where an anisotropic electrically conductive film in which electrically conductive particles are randomly scattered is used, portions where electrically conductive particles are sparse and portions where they are dense occur. As a result, there is a possibility that no electrically conductive particle will be trapped on the projection portion 28a. In such a case, the projection portions 28a will directly contact the input and output terminals 19a and 19b. As a result, adaptability to a change in the distance between the input and output bumps 21a and 21b and the input and output terminals 19a and 19b after connection decreases, and consequently the conduction reliability may be compromised.

FIG. 7 illustrates an example in which electrically conductive particles 4 are trapped on a recess portion 28b of the region having a height difference of greater than or equal to 20% of the particle size of the electrically conductive particle 4, in an input bump 21a or an output bump 21b. The electrically conductive particles 4 bite into the recess portion 28b. The input and output bumps 21a and 21b may have variations in hardness due to variations in the material. Thus, in the pressure bonding step, some electrically conductive particles 4 may bite into the input bumps 21a and the output bumps 21b. In this case too, adaptability to a change in the distance between the input and output bumps 21a and 21b and the input and output terminals 19a and 19b after connection decreases, and consequently the conduction reliability may be compromised.

Percentage of Area Occupied by Electrically Conductive Particles

The area occupied by the electrically conductive particles 4 preferably constitute greater than or equal to 10% of the effective bump area. The effective bump area is the area where any of the input terminals 19a and a corresponding one of the input bumps 21a overlap each other or any of the output terminals 19b and a corresponding one of the output bumps 21b overlap each other. The electrically conductive particles 4 are trapped on the area, and thus the area contributes to anisotropically electrically conductive connection. When the electrically conductive particles 4 occupy greater than or equal to 10% of the effective bump area, a large number of electrically conductive particles can be trapped on the region having a height difference of less than 20% of the particle size, which occupies greater than or equal to 30% of the surface area of the bump. As a result, electrical continuity and visibility of the indentations, via the trapped electrically conductive particles 4, are ensured.

Minimum Number of Particles Trapped

As described above, the input and output bumps 21a and 21b, each of which includes the recess and projection 28, are connected to the input and output terminals 19a and 19b via the anisotropic electrically conductive film 1, in which the electrically conductive particles 4 are independent of and out of contact with one another and are unevenly distributed. In the recess and projection 28, the region having a height difference of greater than or equal to 20% of the particle size of the electrically conductive particles 4 occupies less than or equal to 70% of the surface area of the bump. With this configuration, in the resulting liquid crystal display panel 1, at least three electrically conductive particles 4 are trapped on each of the input and output bumps 21a and 21b. Thus, for the liquid crystal display panel 1, electrical continuity and visibility of the indentations, via the trapped electrically conductive particles 4, are ensured.

Percentage of Independent Indentations

The input and output bumps 21a and 21b, each of which includes the recess and projection 28, are connected to the input and output terminals 19a and 19b via the anisotropic electrically conductive film 1, in which the electrically conductive particles 4 are independent of and out of contact with one another and are unevenly distributed. In the recess and projection 28, the region having a height difference of greater than or equal to 20% of the particle size of the electrically conductive particles 4 occupies less than or equal to 70% of the surface area of the bump. With this configuration, in the resulting liquid crystal display panel 1, independent ones of the indentations of electrically conductive particles 4 in the surface of each of the bumps constitute greater than or equal to 70% of the electrically conductive particles 4 trapped on the surface of each of the input and output bumps 21a and 21b. Thus, the indentations appearing in the input and output terminals 19a and 19b are visible with distinct contrast or curves defining the contrast. Thus, the visibility of the individual indentations is significantly improved. Consequently, for the liquid crystal display panel 10, the connectivity between the input and output bumps 21a and 21b and the input and output terminals 19a and 19h can be inspected rapidly and accurately based on the indentations.

Anisotropic Electrically Conductive Film

Figure 9:
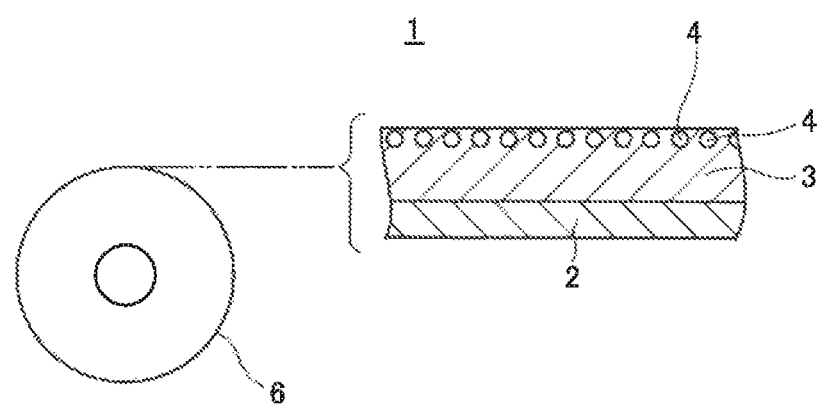
FIG. 9 is a sectional view illustrating an anisotropic electrically conductive film.
Figure 10A:
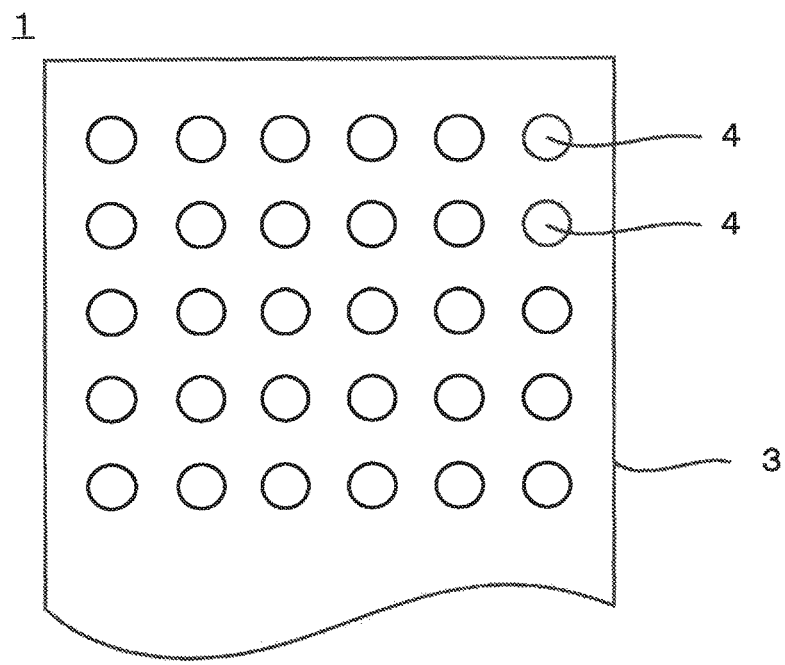
FIGS. 10A and 10B are views illustrating an anisotropic electrically conductive film in which electrically conductive particles are disposed in regular rows in lattice form.
Figure 10B:
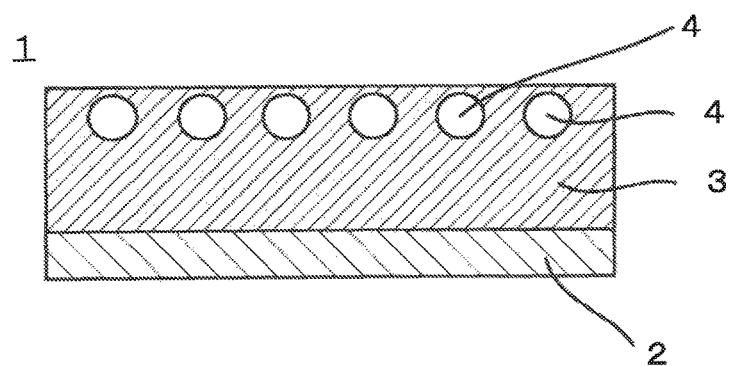
Figure 11A:
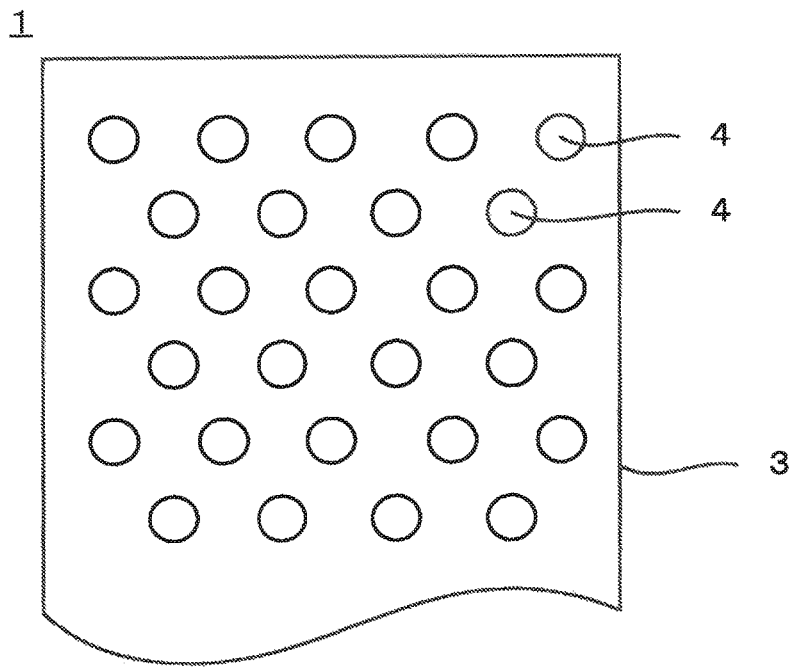
FIGS. 11A and 11B are views illustrating an anisotropic electrically conductive film in which electrically conductive particles are disposed in regular rows in hexagonal lattice form.
Figure 11B:
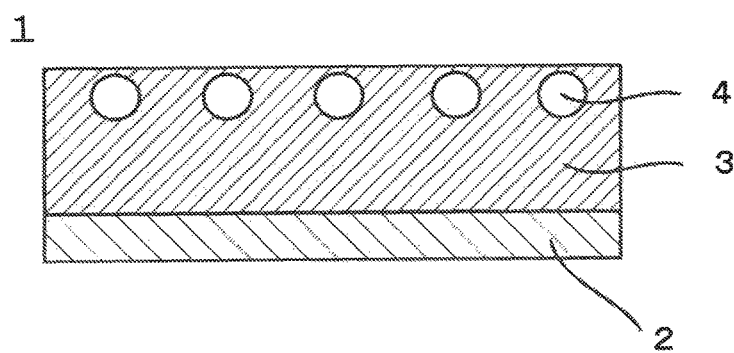

Next, the anisotropic electrically conductive film 1 will be described. As illustrated in FIG. 9, the anisotropic electrically conductive film (ACF) 1 includes a release film 2 that serves as a base material and a binder resin layer (adhesive layer) 3 containing electrically conductive particles 4 formed on the release film 2. The anisotropic electrically conductive film 1 is a thermosetting type adhesive or an optically curing type adhesive that is hardened by ultraviolet light or the like. The anisotropic electrically conductive film 1 is adhered to the input and output terminals 19a and 19b, which are formed on the transparent board 12 of the liquid crystal display panel 10. The liquid crystal drive IC 18 is mounted on the anisotropic electrically conductive film 1. The anisotropic electrically conductive film 1 is fluidized by the heat and pressure applied by the thermocompression bonding head 33 so that the electrically conductive particles 4 are pressed and squashed between the mutually opposing input and output terminals 19a and 19b of the transparent electrode 17 and input and output bumps 21a and 21b of the liquid crystal drive IC 18, and then is subjected to heat or is irradiated with ultraviolet rays to be hardened in this state in which the electrically conductive particles are pressed and squashed. Due to this, the anisotropic electrically conductive film 1 can connect the transparent board 12 and the liquid crystal drive ICs 18, and can make them electrically continuous.

Furthermore, in this anisotropic electrically conductive film 1, the binder resin layer 3, which is a typical one, contains a film formation resin, a thermosetting resin, a latent curing agent, a silane coupling agent, and the like. The electrically conductive particles 4 are disposed, for example, in regular rows in a predetermined pattern in the binder resin layer 3 so that the electrically conductive particles 4 can be dispersed to be independent of and out of contact with one another and be unevenly distributed in the binder resin layer 3.

The release film 2 that supports the binder resin layer 3 is produced by applying a release agent such as silicone or the like to, for example polyethylene terephthalate (PET), oriented polypropylene (OPP), poly-4-methylpentene-1 (PMP), or polytetrafluoroethylene (PTFE). The release film 2 prevents drying of the anisotropic electrically conductive film 1 and also preserves the shape of the anisotropic electrically conductive film 1.

The film formation resin contained in the binder resin layer 3 is preferably a resin having average molecular weight of approximately from 10000 to 80000. Examples of the film formation resin include various types of resins, such as epoxy resin, modified epoxy resin, urethane resin, and phenoxy resin. Among these, phenoxy resin is particularly preferable, from the standpoints of layer formation state, connection reliability, and the like.

The thermosetting resin is not particularly limited. Examples of the thermosetting resin include commercially available epoxy resin, and acrylic resin.

The abovementioned epoxy resin is not particularly limited, and examples of the epoxy resin include naphthalene type epoxy resin, biphenyl type epoxy resin, phenol novolak type epoxy resin, bisphenol type epoxy resin, stilbene type epoxy resin, triphenol methane type epoxy resin, phenol aralkyl type epoxy resin, naphthol type epoxy resin, dicyclopentadiene type epoxy resin, triphenylmethane type epoxy resin, or the like. These substances may be used singly, or two or more types thereof may be used in combination.

The abovementioned acrylic resin is not particularly limited. An acrylic compound, a liquid acrylate, or the like may be selected as appropriate, according to the objective. Examples of the acrylic resin include methyl acrylate, ethyl acrylate, isopropyl acrylate, isobutyl acrylate, epoxy acrylate, ethylene glycol diacrylate, diethylene glycol diacrylate, trimethylolpropane triacrylate, dimethylol tricyclodecane diacrylate, tetramethylene glycol tetraacrylate, 2-hydroxy-1,3-diacryloxypropane, 2,2-bis [4-(acryloxymethoxy) phenyl] propane, 2,2-bis [4-(acryloxyethoxy) phenyl] propane, dicyclopentenyl acrylate, tricyclodecanyl acrylate, tris (acryloxyethyl) isocyanurate, and urethane acrylate. It is also possible to employ methacrylate as the acrylate. These substances may be used singly, or two or more types thereof may be used in combination.

The abovementioned latent curing agent is not particularly limited, and examples thereof include various types of curing agents such as the heat curing type and the UV curing type. Such a latent curing agent normally does not react, but is activated by a trigger of some type such as heat, light, or pressure that is selected according to the application, and thereby the reaction starts. Methods for activating thermally activated type latent curing agents include: methods of generating active species (cations, anions, or radicals) by dissociation reaction due to application of heat or the like; methods of initiating the curing reaction by compatibilizing and dissolving curing agents which are stably dispersed in epoxy resin around room temperature, with epoxy resin at high temperature; methods of initiating the curing reaction by eluting a curing agent of the molecular sieve sealed type at high temperature; and methods of elution-curing with microcapsules. As latent curing agents of the thermally activated type, agents of the imidazole type, agents of the hydrazide type, boron trifluoride-amine complex compounds, sulfonium salts, amine imides, polyamine salts, dicyandiamides, or the like, or modified products of the above are available; and these may be used either singly or as mixtures or two of more thereof. Among these, latent curing agents of the microcapsule imidazole type are suitable.

The abovementioned silane coupling agent is not particularly and examples thereof include an epoxy type, an amino type, a mercapto-sulfide type, or a ureide type. Addition of this silane coupling agent enhances the adherence at the interface between the organic material and the inorganic material.

Electrically Conductive Particles

For the electrically conductive particles 4, any type of per se known electrically conductive particles used in the anisotropic electrically conductive films 1 may be suggested. For example, particles made from various types of metal or metal alloy such as nickel, iron, copper, aluminum, tin, lead, chromium, cobalt, silver, and gold, or particles made by coating the surfaces of particles made from metallic oxide, carbon, graphite, glass, ceramic, plastic or the like with such a metal, or particles made by further coating the surfaces of such particles with a thin electrically insulating layer, or the like may be suggested as the electrically conductive particles 4. In the case where the surfaces of the resin particles are to be coated with a metal, then particles made from, for example, epoxy resin, phenol resin, acrylic resin, acrylonitrile-styrene (AS) resin, benzoguanamine resin, divinylbenzene based resin, or styrene based resin may be suggested as the resin particles. The size of the electrically conductive particles 4 is preferably from 1 to 10 μm, but the present invention is not to be considered as being limited thereto.

Electrically Conductive Particle Rows

Figure 12A:
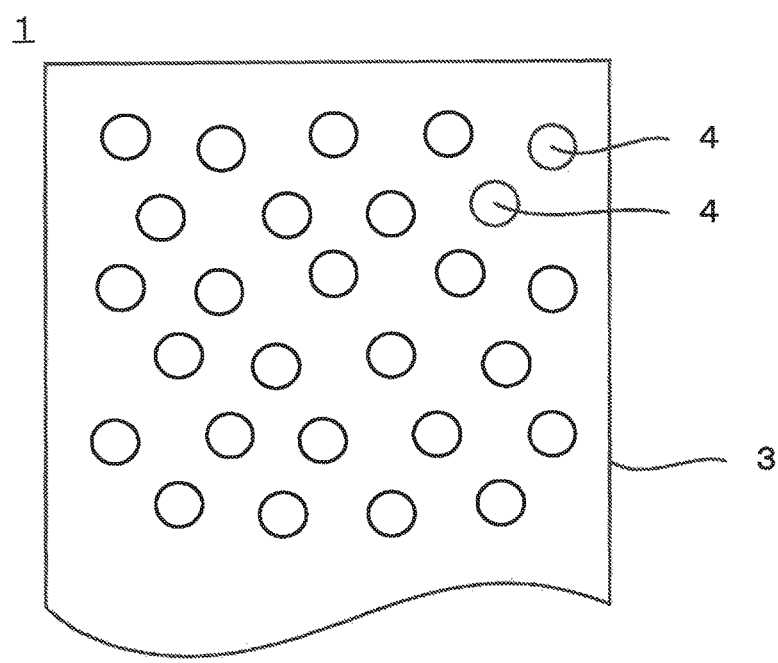
FIGS. 12A and 12B are views illustrating an anisotropic electrically conductive film in which electrically conductive particles are independent of and out of contact with one another and are unevenly distributed in an irregular manner.
Figure 12B:
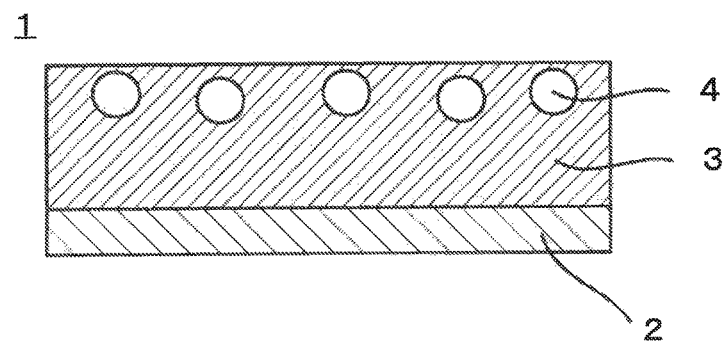

In the anisotropic electrically conductive film 1, when viewed in plan, the electrically conductive particles 4 are disposed in rows to be independent of and out of contact with one another and are unevenly distributed. For example, the electrically conductive particles 4 are disposed in a predetermined row pattern. As illustrated in FIGS. 10A, 10B, 11A, and 11B, the electrically conductive particles 4 are disposed in regular rows in a square lattice or disposed in regular rows in a hexagonal lattice. The pattern in which the electrically conductive particles 4 are arranged may be set as desired. The spacing between adjacent electrically conductive particles 4 may be adjusted as appropriate. For example, as illustrated in FIGS. 12A and 12B, the electrically conductive particles 4, which are independent of and out of contact with one another, may be unevenly distributed, in an irregular manner. That is, the spacing may vary among the rows in different directions.

Figure 13A:
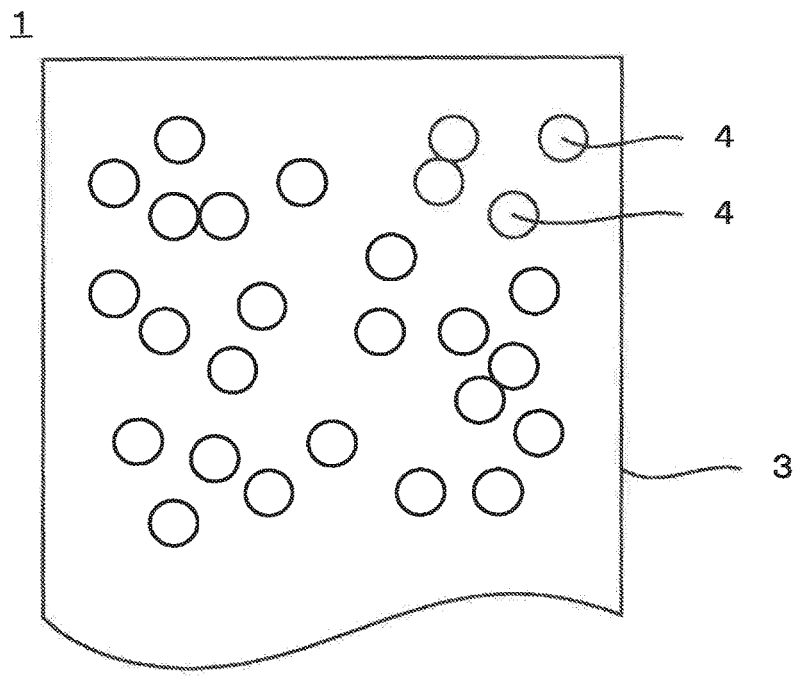
FIGS. 13A and 13B are views illustrating an anisotropic electrically conductive film in which electrically conductive particles are randomly scattered.
Figure 13B:
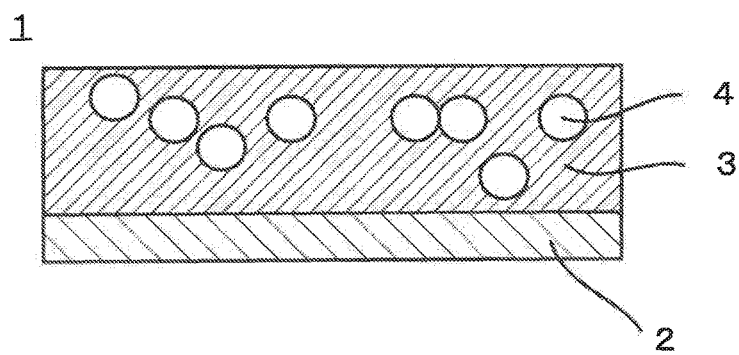

In the anisotropic electrically conductive film 1, when viewed in plan, the electrically conductive particles 4 are disposed in rows to be independent of and out of contact with one another. As a result, it is more likely that the electrically conductive particles 4 will be trapped on the region, in the recess and projection 28 of each of the input and output bumps 21a and 21b, having a height difference of less than 20%, than in the case where, as illustrated in FIGS. 13A and 13B, the electrically conductive particles 4 are randomly scattered and thus sparse portions and dense portions in the distribution of the electrically conductive particles occur as a result of, for example, aggregation. Thus, the conduction reliability is improved, and in addition, the visibility of indentations, which appear in the input and output terminals 19a and 19b, is improved for the inspection after connection of the liquid crystal drive IC 18. In the case where some electrically conductive particles are held on flat surfaces of the input and output bumps 21a and 21b having the recess and projection 28, the conditions of the flat surfaces of the bumps can be ascertained by the indentations after connection. Furthermore, by comparing the degrees of flattening of the electrically conductive particles 4, the number of those of the electrically conductive particles 4 that have been sufficiently pressed can be easily ascertained.

On the other hand, in the case where the electrically conductive particles are randomly scattered, a fewer number of electrically conductive particles can be trapped on each bump, which is small and narrow, and it is less likely that an electrically conductive particle will be trapped on the region having a height difference of less than 20% or the projection portion 28a of the recess and projection 28. As a result, the conduction reliability may be compromised.

In the anisotropic electrically conductive film 1, when viewed in plan, the electrically conductive particles 4 are independent of and out of contact with one another and are unevenly distributed. This configuration increases the probability of trapping of the individual electrically conductive particles 4 and consequently can reduce the quantity of the electrically conductive particles 4 to be included in the film, as compared with the case where the electrically conductive particles 4 are randomly scattered. The comparison is based on the assumption that the same, highly integrated liquid crystal drive ICs 18 are used for anisotropic connection. In the case where the electrically conductive particles 4 are randomly scattered, there is a concern that aggregating or coupling may occur in the spaces between bumps because a certain quantity or a higher quantity of electrically conductive particles are necessary. However, with the above configuration, in which the electrically conductive particles 4 are independent of and out of contact with one another, when viewed in plan, the occurrence of a short circuit is inhibited.

In the anisotropic electrically conductive film 1, when viewed in plan, the electrically conductive particles 4 are independent of and out of contact with one another and are unevenly distributed. This configuration prevents the occurrence of portions where the electrically conductive particles 4 are sparse and portions where they are dense in the plane of the film even when the electrically conductive particles 4 are loaded into the binder resin layer 3 at high density. Accordingly, with the anisotropic electrically conductive film 1, it is possible to appropriately trap the electrically conductive particles 4, even in the case of input and output terminals 19a and 19b and input and output bumps 21a and 21b whose pitch has been made finer.

This type of anisotropic electrically conductive film 1 may, for example, be manufactured: by a method of applying adhesive to a stretchable sheet, and, after having arranged the electrically conductive particles 4 thereon in a single layer, stretching that sheet at a desired stretching magnification; or by a method of, after having arranged the electrically conductive particles 4 on a board in a predetermined arrangement pattern, transferring the electrically conductive particles 4 to the binder resin layer 3 that is supported on the release film 2; by a method of supplying the electrically conductive particles 4 onto the binder resin layer 3 that is supported on the release film 2 via an arrangement plate on which opening portions are provided corresponding to an arrangement pattern, or the like.

It should be understood that the shape of the anisotropic electrically conductive film 1 is not particularly limited. For example, as illustrated in FIG. 9, it could be made in the shape of an elongated tape that can be wound up on a winding reel 6, so that just a predetermined length can be cut off to be used.

In the above embodiment, an adhesive film is described as an example of the anisotropic electrically conductive film 1. In the adhesive film, the electrically conductive particles 4, which are independent of and out of contact with one another, are unevenly distributed in regular rows or otherwise in the binder resin layer 3, which is in the form of a film. However, the adhesive according to the present invention is not limited to this example. For example, the adhesive may be formed of a stack of layers, which may include an insulating adhesive layer exclusively made of the binder resin 3 and an electrically conductive particle-containing layer made of the binder resin 3 and the electrically conductive particles 4, which are independent of and out of contact with one another and unevenly distributed in the binder resin 3. The anisotropic electrically conductive film 1 may be configured in a manner other than the manner illustrated in FIG. 9, in which the electrically conductive particles 4 are disposed in a single layer, provided that they are independent of and out of contact with one another and are unevenly distributed. The electrically conductive particles 4 may be disposed in rows in a plurality of binder resin layers 3 and, when viewed in plan, may be unevenly distributed in a regular or irregular manner. Even further, in the anisotropic electrically conductive film 1, it would also be acceptable for the particles to be dispersed 2p individually at predetermined distances apart within at least one layer of a multilayered structure.

Process of Connection

Next, the connection process in which the liquid crystal drive IC 18 is connected to the transparent board 12 will be described. First, the anisotropic electrically conductive film 1 is temporarily adhered to the mounting portion 27 of the transparent board 12 on which the input and output terminals 19a and 19h are formed. Next, this transparent board 12 is mounted on a stage of a connection device, and the liquid crystal drive IC 18 is disposed over the mounting portion 27 of the transparent board 12, interposed by the anisotropic electrically conductive film 1.

Next, heat and pressure are applied to the liquid crystal drive IC 18 from above at a predetermined pressure level and for a predetermined time period by a thermocompression bonding head 33 heated to a predetermined temperature, so that the binder resin layer 3 is caused to harden. Due to this, the binder resin layer 3 of the anisotropic electrically conductive film 1 becomes somewhat fluid, and, flows out between the mounting surface 18a of the liquid crystal drive IC 18 and the mounting portion 27 of the transparent board 12, also the electrically conductive particles 4 in the binder resin layer 3 are sandwiched, pressed and squashed between the input and output bumps 21a and 21b of the liquid crystal drive IC 18 and the input and output terminals 19a and 19b of the transparent board 12.

As a result, electrical connection between the input and output bumps 21a and 21b and the input and output terminals 19a and 19b is established by the electrically conductive particles 4 being sandwiched between them, and in this state the binder resin is hardened by application of heat by the thermocompression bonding head 33. Due to this, it is possible to manufacture the liquid crystal display panel 10 in which electrical continuity is ensured between the input and output bumps 21a and 21b of the liquid crystal drive IC 18 and the input and output terminals 19a and 19b formed on the transparent board 12. The sandwiched and pressed electrically conductive particles 4 (reflections of the squashed electrically conductive particles 4) in the input and output terminals 19a and 19b are the indentations.

Those of the electrically conductive particles 4 that are not between the input and output bumps 21a and 21b and the input and output terminals 19a and 19b are dispersed in the binder resin in the spaces 23 between adjacent ones of the input and output bumps 21a and 21b, and their state of mutual electrical insulation is maintained. Accordingly, in this liquid crystal display panel 10, electrical continuity is only set up between the input and output bumps 21a and 21b of the liquid crystal drive IC 18 and the input and output terminals 19a and 19b of the transparent board 12. The binder resin may be of a radically polymerizable fast curing type so that the binder resin can be cured rapidly even with a short period of heating. Moreover, the anisotropic electrically conductive film 1 is not limited to the thermal curing type, provided that pressurized connection is performed. An adhesive of the photocuring type or the photo-thermal dual curing type may be employed.

Visibility of Indentations

As a result of pressing the electrically conductive particles 4 between the input and output bumps 21a and 21b, indentations 30, which are independent of and out of contact with one another, can be observed from the transparent board 12 side, in the locations of the input and output terminals 19a and 19b. After connection of the liquid crystal drive IC 18, the connectivity can be inspected by performing visual observation (e.g., with a microscope) or by capturing images for observation, from the rear side of the transparent board 12 (opposite to the input and output terminals 19a and 19b).

Figures 14A, 14B, 14C:
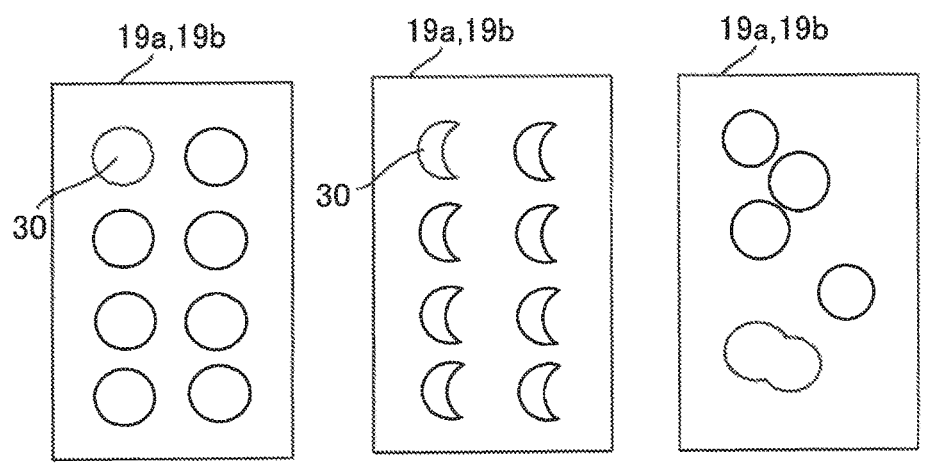
FIGS. 14A to 14C are plan views illustrating indentations appearing in terminals.

The indentations 30 are pressure marks, of the electrically conductive particles 4, that appear in the input and output terminals 19a and 19b of the transparent electrode 17 after the high hardness electrically conductive particles 4, trapped between the input and output bumps 21a and 21b and the input and output terminals 19a and 19b, are pressed by a thermocompression bonding head 33. The indentations 30 can be visually identified by observation from the rear side of the transparent board 12. The shape of the indentations 30 is substantially circular as illustrated in FIG. 14A, with the diameter typically being greater than or equal to the particle size of the electrically conductive particles 4. In general, as illustrated in FIG. 14B, the shape of the indentations 30 is mostly constituted by curves, while one side of the shape may be blurred. The curves may constitute greater than or equal to 40%, preferably greater than or equal to 50%, and more preferably greater than or equal to 60% of the curve of a corresponding circle. That is, it is sufficient that the curves represent a substantially circular shape. In the case of metal particles, linear states may be included in some cases.

The contrast and the outer diameter of the indentations 30 will vary depending on the magnitude of the force applied to the electrically conductive particles 4. Thus, the indentations can be an indicator for determining whether the pressure by the thermocompression bonding head 33 has been uniformly applied to the input and output terminals 19a and 19b and in each of the input and output terminals 19a and 19b.

In a case where an anisotropic electrically conductive film in which the electrically conductive particles 4 are randomly scattered in the binder resin layer 3 is used for connection, the resulting connection body will be as follows. As described above, a fewer number of electrically conductive particles can be trapped on the bumps, which are small and narrow. Also, even in a case where some electrically conductive particles are trapped on the regions having a height difference of less than 20% and/or the projection portion 28a of the recess and projection 28, the indentations 30 appear in the input and output terminals in an irregular manner, and they are close to each other or overlap each other as illustrated in FIG. 14C. Thus, the visibility of the indentations 30 is poor. Ascertaining of their conditions is laborious and therefore the inspection is time consuming. Also, the accuracy in identifying the indentations 30 decreases. That is, the curves defining the indentations 30 cannot be easily discerned. Furthermore, for inspections by automatic image processing, setting of identification criteria is difficult because of the poor visibility. As a result, the accuracy in identification itself decreases. This is because, depending on the resolution, the image may look like a combination of straight lines.

In contrast, the liquid crystal display panel 10, according to the present invention, is formed by using the anisotropic electrically conductive film 1, in which the electrically conductive particles 4 are disposed in rows to be independent of and out of contact with one another. Thus, on each of the input and output terminals 19a and 19b, the electrically conductive particles 4 are disposed in rows and held in this state. As a result, the indentations 30 appear in a regular manner, each being independent, as illustrated in FIG. 14A. Thus, the indentations 30 appearing in the input and output terminals 19a and 19b are visible with distinct contrast or curves defining the contrast, and thus the visibility of the individual indentations 30 is significantly improved. As a result, in the liquid crystal display panel 10, the connectivity between the input and output bumps 21a and 21b and the input and output terminals 19a and 19b can be inspected rapidly and accurately based on the indentations 30.

The visibility of the individual indentations 30, which appear in the input and output terminals 19a and 19b, is ensured by the contrast with the smooth surface, free of the electrically conductive particles 4, provided that the indentations 30 are independent of and out of contact with one another when they appear. Thus, the indentations 30 may be adjacent to one another. However, it is preferable that the indentations 30 appear with a predetermined spacing between one another. For example, it is preferable that the spacing be greater than or equal to 0.2 times the outside diameter of the indentation, and it is more preferable that the spacing be greater than or equal to 0.4 times the outside diameter. The contrast with the smooth surface mentioned above may appear as curves.

Those of the indentations 30 that are independent of and out of contact with one another are preferably present in an amount of greater than or equal to 70% by the number of the electrically conductive particles 4 present in the surface of each of the input and output terminals 19a and 19b, more preferably in an amount of greater than or equal to 80%, and even more preferably in an amount of greater than or equal to 90%. The phrase "those of the indentations 30 that are independent of and out of contact with one another" refers to indentations, of electrically conductive particles 4, that are each present as a separate piece. Indentations that are not independent are those that are adjacent to or overlap another one or more indentations. In the case where a plurality of the electrically conductive particles 4 are intentionally coupled together and disposed in rows, the independence is determined based on the unit.

EXAMPLES

Next, examples of the present invention will be described. In this example, using an anisotropic electrically conductive film in which electrically conductive particles are disposed in rows to be independent of and out of contact with one another or an anisotropic electrically conductive film in which electrically conductive particles are randomly scattered, connection body samples were produced, each by connecting an evaluation IC to an evaluation glass board. The bump of each evaluation IC included, in the surface, a recess and projection having a height difference of greater than or equal to 20% of the particle size of the electrically conductive particles. The recess and projection occupied a predetermined fraction. For each of the samples, the number of indentations that appeared in the terminal of the glass board was counted, and also, the electrical conduction resistances, initial and after reliability testing, and the rate of short circuit occurrence between adjacent bumps were measured.

Anisotropic Electrically Conductive Film

The binder resin layer of the anisotropic electrically conductive film that was used for connection of the evaluation ICs was manufactured by adding 50 parts by mass of a phenoxy resin (trade name: YP 50, available from NIPPON STEEL & SUMIKIN CHEMICAL CO., LTD), 45 parts by mass of an epoxy resin (trade name: YL 980, available from Mitsubishi Chemical Corporation), 2 parts by mass of a silane coupling agent (trade name: KBM-403, available from Shin-Etsu Chemical Co., Ltd.), and 3 parts by mass of a cationic curing agent (trade name: SI-60 L, available from SANSHIN CHEMICAL INDUSTRY CO., LTD) to a solvent, to prepare a binder resin composition, and by applying this binder resin composition to a release film and drying it in a 70° C. oven to form the layer with a thickness of 16 μm. In each binder resin layer, electrically conductive particles were dispersed or randomly scattered at a predetermined particle density.

Evaluation IC for Measurement of Indentation Number and Electrical Conduction Resistance As an evaluation element for measurement of the indentation number and the electrical conduction resistance, the following evaluation IC was used: external shape: 0.7 mm×20 mm, 0.2 mm in thickness; bump; Au-plated, 15 μm in width×100 μm in length, 12 μm in height, bump pitch of 14 μm.

Evaluation IC for Measurement of Inter-Bump Short Circuit Occurrence Rate

As an evaluation element for measurement of the inter-bump short circuit occurrence rate, a comb-shaped TEG (test element group) with a space of 7.5 μm was used.

For both the evaluation IC for measurement of the indentation number and electrical conduction resistance and the evaluation IC for measurement of the inter-bump short circuit occurrence rate, three different ICs were prepared. In one of the ICs, the area occupied by the region having a height difference of greater than or equal to 20% of the electrically conductive particle size was 70%; in another one of the ICs, the area was 50%; and in the remaining one of the ICs, the area was 30%.

Evaluation Glass Board

A piece of ITO patterned glass (available from Corning Incorporated) was used as an evaluation glass board to which the evaluation IC for measurement of the electrical conduction resistance and the evaluation IC for measurement of the number of trapped particles via indentations were to be connected. The piece of glass had an external shape of 30 mm×50 mm and a thickness of 0.5 mm, and included a terminal array of a plurality of terminals. The terminals had the same size and the same pitch as the bumps of the evaluation ICs for measurement of the electrical conduction resistance.

After having temporarily adhered the anisotropic electrically conductive film to this evaluation glass board, the evaluation ICs were mounted thereon, and then thermocompression bonding using a thermocompression bonding head was performed thereon for 5 seconds at 180° C. and 80 MPa. Thus, the connection body samples were produced. For each of these connection body samples, the number of indentations that appeared in the terminals of the evaluation glass board, the initial electrical conduction resistance, the electrical conduction resistance after reliability testing, and the inter-bump short circuit occurrence rate were measured. The reliability testing was performed under the following conditions: at 85° C. and 85% RH, and for 500 hours.

For each of the connection body samples to which the evaluation ICs were connected, the terminals were observed from the rear side of the evaluation glass board, and the captured images were processed by an image processor (WinROOF, available from MITANI Corporation) to determine the number of indentations and the percentage by number of independent ones of the electrically conductive particles. Furthermore, the effective bump area was determined from the connected bump width. The effective bump area is the area where the bump and a corresponding terminal overlap each other, and the area contributes to anisotropically electrically conductive connection. Also, based on the electrically conductive particle size and the number of indentations, the percentage of the area occupied by the electrically conductive particles in the effective bump area was determined. The connected bump width indicates a width of misalignment between the bump (15 μm in width) and the terminal A connected bump width of 15 μm indicates that there is no misalignment and the entire surface constitutes the effective bump area, which contributes to anisotropically electrically conductive connection. A connected bump width of 10 μm indicates that there is a misalignment of 5 μm between the bump and the terminal and the effective bump area that contributes to anisotropically electrically conductive connection is reduced.

Example 1

In Example 1, an anisotropic electrically conductive film was used in which electrically conductive particles were dispersed in hexagonal lattice form in a binder resin layer to be independent of and out of contact with one another and unevenly distributed. For manufacturing the anisotropic electrically conductive film used in this Example 1, an adhesive was applied to a stretchable sheet, and, after having arranged electrically conductive particles evenly in rows in a single layer thereon in lattice form, in a state in which this sheet was stretched by a desired stretching magnification, the binder resin layer was laminated thereon. The electrically conductive particles that were used (trade name: AUL704, available from SEKISUI CHEMICAL CO., LTD.) had a particle size of 4 µm, and the number density of particles was 28000/mm$^2$.

In Example 1, the following evaluation IC was used for measurement of the indentation number and electrical conduction resistance. The surface of each bump where electrically conductive particles were to be trapped included a recess and projection having a height difference of greater than or equal to 10% of the particle size of the electrically conductive particles. In the surface of each bump, the region having a height difference of greater than or equal to 20% of the particle size of the electrically conductive particles occupied 50% of the surface area of the bump, with the height difference being measured from the position defining the maximum projection. In Example 1, the connected bump width of the connection body sample was 10 µm, with a misalignment of 5 µm produced.

Example 2

In Example 2, a connection body sample was manufactured using the same anisotropic electrically conductive film and the same evaluation ICs as in Example 1 under the same conditions as in Example 1. In Example 2, the connected hump width of the connection body sample was 5 µm, with a misalignment of 10 µm produced.

Example 3

In Example 3, a connection body sample was manufactured using the same anisotropic electrically conductive film and the same evaluation ICs as in Example 1 under the same conditions as in Example 1. In Example 3, the connected bump width of the connection body sample was 15 µm, with no misalignment produced.

Example 4

In Example 4, a connection body sample was manufactured using the same anisotropic electrically conductive film as in Example 1 under the same conditions as in Example 1. The evaluation IC used for measurement of the indentation number and electrical conduction resistance was as follows. The surface of each bump where electrically conductive particles were to be trapped included a recess and projection having a height difference of greater than or equal to 10% of the particle size of the electrically conductive particles. In the surface of each bump, the region having a height difference of greater than or equal to 20% of the particle size of the electrically conductive particles occupied 70% of the surface area of the bump, with the height difference being measured from the position defining the maximum projection. In Example 4, the connected bump width of the connection body sample was 10 µm, with a misalignment of 5 µm produced.

Example 5

In Example 5, a connection body sample was manufactured using the same anisotropic electrically conductive film and the same evaluation ICs as in Example 4 under the same conditions as in Example 1. In Example 5, the connected bump width of the connection body sample was 5 µm, with a misalignment of 10 µm produced.

Example 6

In Example 6, a connection body sample was manufactured using the same anisotropic electrically conductive film as in Example 1 under the same conditions as in Example 1. The evaluation IC used for measurement of the indentation number and electrical conduction resistance was as follows. The surface of each bump where electrically conductive particles were to be trapped included a recess and projection having a height difference of greater than or equal to 10% of the particle size of the electrically conductive particles. In the surface of each bump, the region having a height difference of greater than or equal to 20% of the particle size of the electrically conductive particles occupied 30% of the surface area of the bump, with the height difference being measured from the position defining the maximum projection. In Example 6, the connected bump width of the connection body sample was 10 µm, with a misalignment of 5 µm produced.

Example 7

In Example 7, a connection body sample was manufactured under the same conditions as in Example 4 except that the anisotropic electrically conductive film used included electrically conductive particles (trade name: AUL703, available from SEKISUT CHEMICAL CO., LTD.) having a particle size of 3 µm. In Example 7, the connected hump width of the connection body sample was 10 µm, with a misalignment of 5 µm produced.

Comparative Example 1

In Comparative Example 1, an anisotropic electrically conductive film was used, in which the electrically conductive particles were randomly scattered in the binder resin layer, by adding the electrically conductive particles to the binder resin composition to be prepared, and by applying this composition to the release film and firing it. The electrically conductive particles that were used (trade name: AUL704, available from SEKISUI CHEMICAL CO., LTD.) had a particle size of 4 µm, and the number density of particles was 28000/mm$^2$. The evaluation ICs, the conditions for connection, and the like were the same as in Example 1. In Comparative Example 1, the connected bump width of the connection body sample was 10 µm, with a misalignment of 5 µm produced.

Comparative Example 2

In Comparative Example 2, a connection body sample was manufactured under the same conditions as in Comparative Example 1 except that the anisotropic electrically conductive film used had a number density of particles of 65000 pcs/mm$^2$. In Comparative Example 2, the connected bump width of the connection body sample was 10 µm, with a misalignment of 5 µm produced.

Comparative Example 3

In Comparative Example 3, a connection body sample was manufactured using the same anisotropic electrically conductive film as in Comparative Example 2. The evaluation IC used for measurement of the indentation number and electrical conduction resistance was as follows. The surface of each bump where electrically conductive particles were to be trapped included a recess and projection having a height difference of greater than or equal to 10% of the particle size of the electrically conductive particles. In the surface of each bump, the region having a height difference of greater than or equal to 20% of the particle size of the electrically conductive particles occupied 70% of the surface area of the bump, with the height difference being measured from the position defining the maximum projection. In Comparative Example 3, the connected bump width of the connection body sample was 10 μm, with a misalignment of 5 μm produced.

Comparative Example 4

In Comparative Example 4, a connection body sample was manufactured under the same conditions as in Comparative Example 3 except that the anisotropic electrically conductive film used included electrically conductive particles (trade name: AUL703, available from SEKISUI CHEMICAL CO., LTD.) having a particle size of 3 μm. In Comparative Example 4, the connected bump width of the connection body sample was 10 μm, with a misalignment of 5 μm produced.

tive particles that were dispersed to be independent of and out of contact with one another and unevenly distributed. In the ICs used, the region having a height difference of greater than or equal to 20% of the electrically conductive particles occupied less than or equal to 70% of the surface area of each bump. As a result, the indentation number and the area occupied by the electrically conductive particles constituted greater than or equal to 10% of the effective bump area. Consequently, good conduction reliability was achieved, with the initial electrical connection resistance being less than or equal to 0.3Ω and the electrical conduction resistance after reliability testing being less than or equal to 3.8Ω.

The reason for this is as follows. In the connection body samples of Examples 1 to 7, the region having a height difference of less than 20% of the particle size of the electrically conductive particles 4 constituted greater than or equal to 30%, and some of the electrically conductive particles, which were dispersed independently of one another and unevenly distributed in the binder resin layer, were trapped on the region. As a result, sufficient forcing of the electrically conductive particles 4 was accomplished, and the conduction reliability between the bumps and the terminals was maintained even when the environment changed after connection. In addition, for the connection body samples of Examples 1 to 7, the visibility of the indentations was not compromised and thus reliability of conduction inspections using indentations was ensured.

TABLE 1-1

| | Example 1 | Example 2 | Example 3 | Example 4 | Example 5 | Example 6 |
|---|---|---|---|---|---|---|
| number density of particles (per mm$^2$) | 28000 | 28000 | 28000 | 28000 | 28000 | 28000 |
| percentage by number of independent particles (%) | 99> | 99> | 99> | 99> | 99> | 99> |
| dispersion of electrically conductive particles | independent | independent | independent | independent | independent | independent |
| electrically conductive particle size (μm) | 4 | 4 | 4 | 4 | 4 | 4 |
| area having height difference of 20% or more of particle size (%) | 50 | 50 | 50 | 70 | 70 | 30 |
| connected bump width (μm) | 10 | 5 | 15 | 10 | 5 | 10 |
| indentation number | 8 | 4 | 12 | 5 | 3 | 12 |
| area occupied by particles | 35.2% | 35.2% | 35.2% | 35.2% | 35.2% | 35.2% |
| electrical conduction resistance (Ω) initial | 0.2 | 0.3 | 0.2 | 0.3 | 0.3 | 0.2 |
| electrical conduction resistance (Ω) after reliability testing (Ω) | 2.4 | 3.6 | 2.2 | 3.2 | 3.8 | 2.2 |
| inter-bump short circuit (ppm) | >50 | >50 | >50 | >50 | >50 | >50 |

TABLE 1-2

| | Example 7 | Comparative Example 1 | Comparative Example 2 | Comparative Example 3 | Comparative Example 4 |
|---|---|---|---|---|---|
| number density of particles (per mm$^2$) | 28000 | 28000 | 65000 | 65000 | 65000 |
| percentage by number of independent particles (%) | 99> | 70> | 50> | 50> | 50> |
| dispersion of electrically conductive particles | independent | random | random | random | random |
| electrically conductive particle size (μm) | 3 | 4 | 4 | 4 | 3 |
| area having height difference of 20% or more of particle size (%) | 70 | 50 | 50 | 70 | 70 |
| connected bump width (μm) | 10 | 10 | 10 | 10 | 10 |
| indentation number | 5 | 1 | 5 | 2 | 7 |
| area occupied by particles | 19.8% | 35.2% | 81.6% | 81.6% | 45.9% |
| electrical conduction resistance (Ω) initial | 0.3 | 1.4 | 0.3 | 1.0 | 0.3 |
| electrical conduction resistance (Ω) after reliability testing (Ω) | 3.3 | 9.3 | 3.5 | 8.2 | 2.9 |
| inter-bump short circuit (ppm) | >50 | >50 | 200 | 200 | 200 |

As shown in Table 1, each of the connection body samples of Examples 1 to 7 were as follows. The anisotropic electrically conductive film used included electrically conductive par- Furthermore, for the connection body samples of Examples 1 to 7, the anisotropic electrically conductive films were used in which the electrically conductive particles were dispersed to be independent of and out of contact with one another and were unevenly distributed. As a result, the rate of short circuit occurrence between bumps, which was caused when the electrically conductive particles were connected to each other in the small and narrow inter-bump areas, was less than or equal to 50 ppm.

On the other hand, in the connection body samples of Comparative Examples 1 to 4, the electrically conductive particles were randomly scattered. As a result, even in the cases where the number density of the particles loaded was high, namely, 65000 pcs/mm$^2$, and the region, of the evaluation ICs, having a height difference of greater than or equal to 20% of the electrically conductive particles occupied less than or equal to 70% of the surface area of the bump, the result was that the number of indentations was small and the connection reliability was compromised with the initial electrical conduction resistance being in the range from 0.3Ω to 1.4Ω and the electrical conduction resistance after reliability testing being in the range from 2.9Ω to 9.3Ω.

The reason for this is as follows. In the connection body samples of Comparative Examples 1 to 4, the electrically conductive particles are randomly scattered. As a result, sparse portions and dense portions occurred on the bump surface, and this increased the probability of failure to trap an electrically conductive particle on the region having a height difference of less than 20% of the particle size of the electrically conductive particles 4. In addition, since the inter-bump areas were small and narrow, some bumps were connected to each other via clumped electrically conductive particles existing in the areas. Thus, the rate of short circuit occurrence between bumps was high, namely 200 ppm.

Furthermore, for the connection body samples of Examples 1 to 7, a cross-sectional observation was performed to observe the state in which the electrically conductive particles were held on the bumps. The results obtained were substantially the same as those of the inspection by indentation observation. This indicates that, with the present invention, connection reliability can be evaluated easily and quickly by an indentation observation, which is a non-destructive inspection, without needing a bump cross section observation, which is a destructive inspection and requires many man-hours.

REFERENCE SIGNS LIST

1 Anisotropic electrically conductive film
2 Release film
3 Binder resin layer
4 Electrically conductive particle
6 Winding reel
10 Liquid crystal display panel
11, 12 Transparent board
12a Edge
13 Seal
14 Liquid crystal
15 Panel display unit
16, 17 Transparent electrode
18 Liquid crystal drive IC
18a Mounting surface
19a Input terminal.
19b Output terminal
20a Input terminal array
20b Output terminal array
21a Input bump
21b Output bump
22a Input bump array
22b Output bump array
23 Space between terminals
27 Mounting portion
28 Recess and projection
28a Projection portion
28b Recess portion
31 Board side alignment mark
32 IC side alignment mark
33 Thermocompression bonding head

The invention claimed is:

1. A connection body comprising:
   a transparent board including a plurality of terminals arranged on a surface of the transparent board; and
   an electronic component including a plurality of bumps arranged on a surface of the electronic component, the electronic component facing the transparent board in a first direction and being connected to the transparent board via an anisotropic electrically conductive adhesive including electrically conductive particles dispersed in a binder resin, the electrically conductive particles having a particle size, the plurality of bumps being electrically connected to the plurality of terminals via the electrically conductive particles with the electronically conductive particles trapped between the plurality of bumps and the plurality of terminals,
   wherein the electrically conductive particles are independent of and out of contact with one another, and
   plural bumps of the plurality of bumps each have an uneven surface facing the transparent board and with a surface area, the surface having a recess and a projection having a height difference in the first direction of greater than or equal to 10 percent of the particle size, the surface being a surface where the electrically conductive particles are trapped, the projection being located at a portion of the surface that is closer to the transparent board than a portion of the surface where the recess is located, the recess and projection including a projection portion defining a maximum projection, and at least one region of the surface having a height difference, measured from the projection portion, of greater than or equal to 20 percent of the particle size occupies less than or equal to 70 percent of the surface area.

2. The connection body according to claim 1, wherein an area occupied by the electrically conductive particles constitutes greater than or equal to 10 percent of an area where any of the plurality of terminals and a corresponding one of the plurality of bumps overlap each other.

3. The connection body according to claim 1, wherein at least three of the electrically conductive particles are trapped on each of the plurality of bumps.

4. The connection body according to claim 1, wherein indentations of the electrically conductive particles include independent indentations, and the independent indentations constitute greater than or equal to 70 percent of number of the electrically conductive particles in the surface of each of the plural bumps.

5. A method for manufacturing a connection body, the method comprising:
   mounting an electronic component on a transparent board via an adhesive including electrically conductive particles; and
   pressing, in a first direction, the electronic component against the transparent board and curing the adhesive to electrically connect bumps of the electronic component to terminals of the transparent board via the electrically conductive particles with the electrically conductive particles trapped between the bumps and the terminals, wherein, in the anisotropic electrically conductive adhesive, the electrically conductive particles are dispersed in a binder resin to be independent of and out of contact with one another, and a plurality of the bumps each has an uneven surface facing the transparent board and with a surface area, the surface having a recess and a projection having a height difference in the first direction of greater than or equal to 10 percent of a particle size of the electrically conductive particles, the surface being a surface where the electrically conductive particles are trapped, the projection being located at a portion of the surface that is closer to the transparent board than a portion of the surface where the recess is located, the recess and projection including a projection portion defining a maximum projection, and at least one region of the surface having a height difference, measured from the projection portion, of greater than or equal to 20 percent of the particle size of the electrically conductive particles occupies less than or equal to 70 percent of the surface area.

6. An inspection method for inspecting a connection status of a connection body, the connection body including a transparent board including a plurality of terminals and an electronic component including a plurality of bumps, the electronic component being connected to the transparent board via an anisotropic electrically conductive adhesive including electrically conductive particles dispersed therein with the electrically conductive particles trapped between the plurality of bumps and the plurality of terminals, the method comprising inspecting a connection status of the electronic component by observing indentations of the electrically conductive particles included in the anisotropic electrically conductive adhesive, the indentations appearing in the terminals of the transparent board, wherein, in the anisotropic electrically conductive adhesive, the electrically conductive particles are dispersed in a binder resin to be independent of and out of contact with one another, and a plurality of the bumps each has an uneven surface facing the transparent board and with a surface area, the surface having a recess and a projection having a height difference in a direction in which the electronic component faces the transparent board of greater than or equal to 10 percent of a particle size of the electrically conductive particles, the surface being a surface where the electrically conductive particles are trapped, the projection being located at a portion of the surface that is closer to the transparent board than a portion of the surface where the recess is located, the recess and projection including a projection portion defining a maximum projection, and at least one region of the surface having a height difference, measured from the projection portion, of greater than or equal to 20 percent of the particle size of the electrically conductive particles occupies less than or equal to 70 percent of the surface area.

* * * * *